(12) United States Patent
Cheng et al.

(10) Patent No.: US 9,355,968 B2
(45) Date of Patent: May 31, 2016

(54) SILICON SHIELD FOR PACKAGE STRESS SENSITIVE DEVICES

(71) Applicant: Maxim Integrated Products, Inc., San Jose, CA (US)

(72) Inventors: Ming Cheng, San Jose, CA (US); Ken Wang, Milpitas, CA (US); Tian Tian, Milpitas, CA (US); Mohammad Ayyash, San Jose, CA (US); Tuyen Pham, San Jose, CA (US); Brian Rush, Southlake, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/497,707

(22) Filed: Sep. 26, 2014

(65) Prior Publication Data

US 2015/0364431 A1 Dec. 17, 2015

Related U.S. Application Data

(60) Provisional application No. 62/011,707, filed on Jun. 13, 2014.

(51) Int. Cl.
| | |
|---|---|
| *H01L 23/31* | (2006.01) |
| *H01L 23/00* | (2006.01) |
| *H01L 23/16* | (2006.01) |
| *H01L 23/495* | (2006.01) |

(52) U.S. Cl.
CPC .............. *H01L 23/562* (2013.01); *H01L 23/16* (2013.01); *H01L 24/49* (2013.01); *H01L 23/3107* (2013.01); *H01L 23/49555* (2013.01); *H01L 2224/48247* (2013.01); *H01L 2224/48647* (2013.01); *H01L 2224/48747* (2013.01); *H01L 2224/48847* (2013.01); *H01L 2924/12* (2013.01); *H01L 2924/1304* (2013.01); *H01L 2924/14* (2013.01)

(58) Field of Classification Search
CPC ............ H01L 2224/48247; H01L 2924/0665; H01L 2924/14; H01L 23/562; H01L 23/49579; H01L 23/293; H01L 23/3107; H01L 24/49; H01L 2924/12; H01L 2924/1304; H01L 2224/48647; H01L 2224/48747; H01L 2224/48847
See application file for complete search history.

(56) References Cited

U.S. PATENT DOCUMENTS

| | | | | |
|---|---|---|---|---|
| 5,049,976 | A * | 9/1991 | Demmin | H01L 23/49503 257/717 |
| 5,339,216 | A * | 8/1994 | Lin | H01L 23/16 257/707 |
| 5,528,076 | A * | 6/1996 | Pavio | H01L 21/4821 257/666 |
| 6,326,568 | B2 * | 12/2001 | Martucci | 200/283 |

* cited by examiner

*Primary Examiner* — Roy Potter
(74) *Attorney, Agent, or Firm* — Advent, LLP

(57) ABSTRACT

A surface mount semiconductor package, semiconductor device, and method for fabrication of the surface mount semiconductor package and electrical device are described that include a leadframe assembly, an integrated circuit device disposed on the leadframe assembly, a silicon shield disposed on the integrated circuit device, where the silicon shield is configured to mitigate packaging stress to the integrated circuit device, and a molding layer that encapsulates the integrated circuit device, the silicon shield, and at least a portion of the leadframe assembly.

17 Claims, 3 Drawing Sheets

SILICON SHIELD FOR PACKAGE STRESS SENSITIVE DEVICES

BACKGROUND

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Some fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

SUMMARY

A surface mount semiconductor package, electrical device, and method for fabrication of the surface mount semiconductor package and electrical device are described that include a leadframe assembly, an integrated circuit device disposed on the leadframe assembly, a silicon shield disposed on the integrated circuit device, where the silicon shield is configured to mitigate packaging stress to the integrated circuit device, and a molding layer that encapsulates the integrated circuit device, the silicon shield, and at least a portion of the leadframe assembly. In implementations, the electrical device that employs example techniques in accordance with the present disclosure includes a printed circuit board and a surface mount semiconductor package. In implementations, one process for fabricating the surface mount semiconductor package and/or the semiconductor device that employs example techniques in accordance with the present disclosure includes placing an integrated circuit device on a leadframe assembly, placing a silicon shield on the integrated circuit device, and forming a molding layer that encapsulates the integrated circuit device, the silicon shield, and at least a portion of the leadframe assembly.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Semiconductor packaging facilitates the production of semiconductor devices that are lower in cost, have smaller form factors, and provide lower parasitic effects than devices manufactured utilizing many other packaging technologies. However, packaging stress can affect temperature coefficient (TC) and thermal hysteresis (TH) performance in stress sensitive devices. Accurate measurement devices, for example an active die, can be more sensitive to stress during fabrication and may require minimum signal drift subsequent to package assembly and subsequent to reliability tests, such as Voltage Reference, DAC and ADC tests.

Accordingly, a surface mount semiconductor package, electrical device, and method for fabrication of the surface mount semiconductor package and electrical device are described that include a leadframe assembly, an integrated circuit device disposed on the leadframe assembly, a silicon shield disposed on the integrated circuit device, where the silicon shield is configured to mitigate packaging stress to the integrated circuit device, and a molding layer that encapsulates the integrated circuit device, the silicon shield, and at least a portion of the leadframe assembly. In implementations, the electrical device that employs example techniques in accordance with the present disclosure includes a printed circuit board and a surface mount semiconductor package. In implementations, one process for fabricating the surface mount semiconductor package and/or the semiconductor device that employs example techniques in accordance with the present disclosure includes placing an integrated circuit device on a leadframe assembly, placing a silicon shield on the integrated circuit device, and forming a molding layer that encapsulates the integrated circuit device, the silicon shield, and at least a portion of the leadframe assembly.

The surface mount semiconductor package disclosed herein mitigates the stress effect from package assembly fabrication and reliability testing by placing a silicon shield on the integrated circuit device and/or stress sensitive device, where the silicon shield provides an additional protective layer.

Example Implementations

Figure 1A:
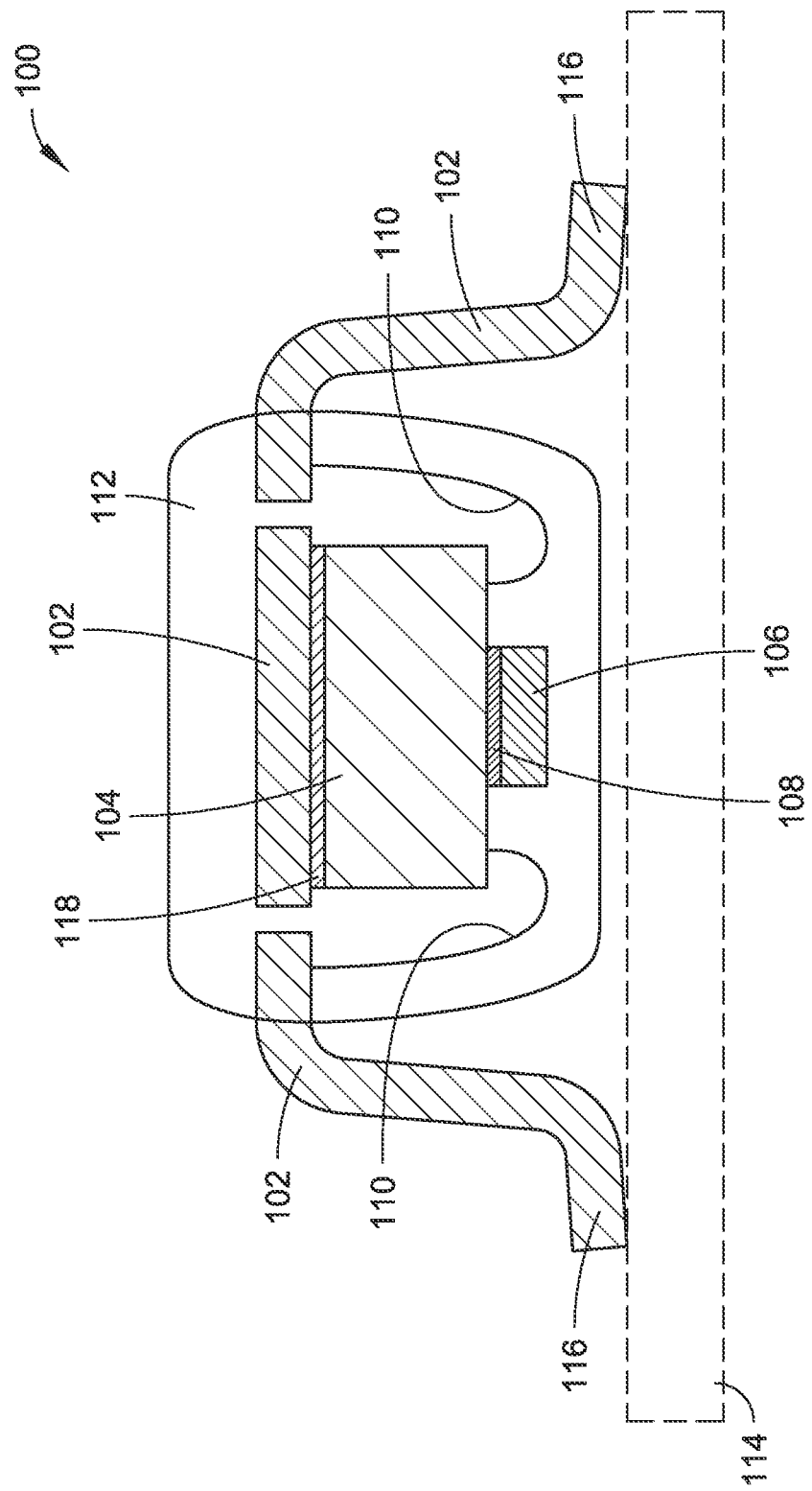
FIG. 1A is a cross section side view illustrating an embodiment of a surface mount semiconductor package that includes a silicon shield disposed on an integrated circuit die, in accordance with an example implementation of the present disclosure.
Figure 1B:
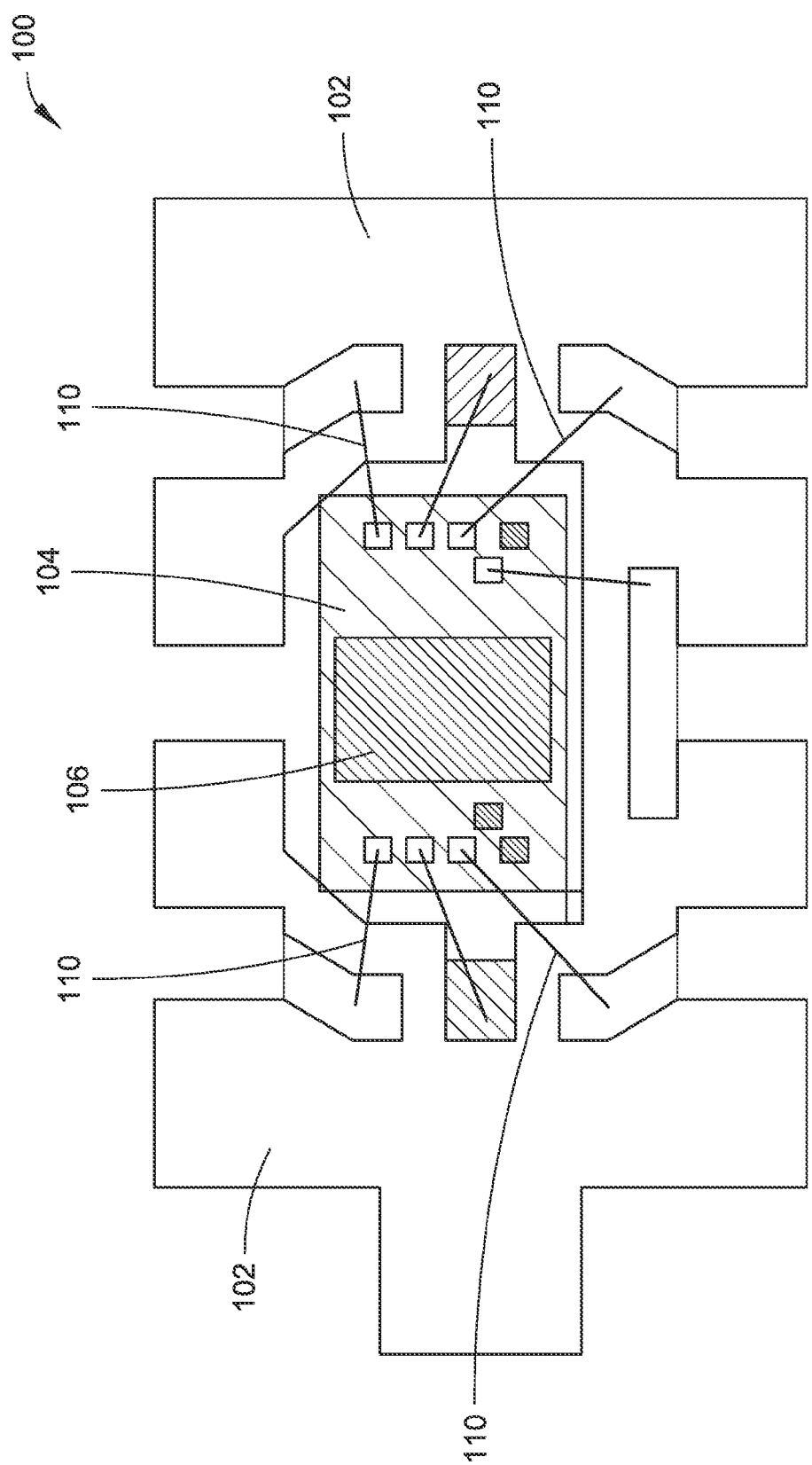
FIG. 1B is a partial top plan view illustrating an embodiment of a surface mount semiconductor package that includes a silicon shield disposed on an integrated circuit die, in accordance with an example implementation of the present disclosure.

FIGS. 1A and 1B illustrate a surface mount semiconductor package 100 and semiconductor device in accordance with an example implementation of the present disclosure. The semiconductor package device 100 can include a semiconductor device configured to be packaged and mounted to an electronic device, such as a printed circuit board 114, to form another electrical device. Some examples of a semiconductor package may include a small outline transistor, accurate measurement device, or other sensitive integrated circuit device.

As shown in FIGS. 1A and 1B, the surface mount semiconductor package 100 may include a leadframe assembly 102. In implementations, a leadframe assembly 102 can include a leadframe, which can further include a metal structure within the surface mount semiconductor package 100 configured to carry an electronic signal from an integrated circuit device 104 to an external device (e.g., a printed circuit board 114). In some examples, a lead frame may be manufactured by removing material from a flat plate of copper or copper-alloy. Some processes used to manufacture a lead frame can include etching (suitable for low volume lead frame fabrication) and/or stamping (suitable for high volume lead frame fabrication). In implementations, the leadframe assembly 102 may include at least one lead frame contact pad 116 and/or pin, which can include a portion of a lead on the lead frame that is configured to provide an electrical contact and/or an electrical signal to an outside device, such as a printed circuit board 114. In other implementations, a lead may be electrically coupled to a lead frame contact pad 116, and the lead frame contact pad 116 can be formed separately from the leadframe assembly 102. In these implementations, the lead frame contact pad 116 can include a metal and/or electrically conductive pad disposed on the bottom of the surface mount semiconductor package 100.

As illustrated in FIGS. 1A and 1B, the surface mount semiconductor package 100 can include an integrated circuit device 104 disposed on the leadframe assembly 102. In implementations, an integrated circuit device 104 can include at least one integrated circuit (e.g., an integrated circuit die) that has been formed from and/or as a portion of a processed semiconductor wafer (not shown). The integrated circuit device 104 may include digital integrated circuits, analog integrated circuits, mixed-signal circuits, and so forth. In one or more implementations, the integrated circuit device 104 may include digital logic devices, analog devices (e.g., amplifiers, etc.), and combinations thereof, etc.

As described above, the integrated circuit device 104 may be fabricated utilizing various fabrication techniques. For example, the integrated circuit device 104 may be fabricated via complimentary metal-oxide-semiconductor (CMOS) techniques, bi-polar semiconductor techniques, and so on. The integrated circuit device 104 may include electrical interconnections formed therein (e.g., integrated circuits, redistribution layers, vias, contact pads, etc.). In implementations, the integrated circuit device 104 can include an active die (e.g., a processor) and/or a passive die (e.g., a capacitor, a transistor, etc.). Additionally, the integrated circuit device 104 can include electrical interconnections (e.g., contacts pads, metal pads, such as copper and/or aluminum, under-ball metallization (UBM), etc.) configured to provide an electrical connection between the integrated circuit device 104 (by way of a redistribution layer, vias, solder bumps, and/or other electrical interconnections) and an external component (e.g., a printed circuit board). The integrated circuit device 104 can be configured to be coupled to the leadframe assembly 102 using surface mount techniques, such as pick-and-place techniques.

In implementations, the integrated circuit device 104 can be physically and/or electrically coupled to the leadframe assembly 102. In one embodiment, the integrated circuit device 104 can be coupled to the leadframe assembly 102 utilizing a die attach 118. A die attach 118 can include a material utilized to couple the integrated circuit device 104 to a leadframe assembly 102. Some examples of a die attach 118 can include an epoxy die attach, a eutectic die attach, and/or a solder connection. In a specific embodiment, the integrated circuit device 104 can be electrically connected to a leadframe assembly 102 using at least one wirebond 110. A wirebond can include an interconnection between an integrated circuit device 104 and a leadframe and/or other packaging. Some examples of wirebond material can include gold, silver, aluminum, and/or copper. In implementations, wirebond diameters may include between about 15 μm up to about several hundred μm (e.g., 200 μm). In another embodiment, the surface mount semiconductor package 100 can include an integrated circuit device 104 having a flip-chip configuration. In this embodiment, the integrated circuit device 104 can be mechanically coupled and electrically connected to the leadframe assembly 102 using at least one solder bump (not shown). A solder bump can be formed on the surface of the integrated circuit device 104. In implementations, the solder bump can include materials that are suitable for soldering, for example lead-free metals such as a Tin-Silver-Copper (Sn—Ag—Cu) alloy (i.e., SAC), a Tin-Silver (Sn—Ag) alloy, a Tin-Copper (Sn—Cu) alloy, etc. In one specific embodiment, a Tin-Lead (PbSn) material may be used as the solder bump. In embodiments using at least one solder bump, the solder bump can function as the die attach 118.

As shown in FIGS. 1A and 1B, the surface mount semiconductor package 100 includes a silicon shield 106 coupled to the integrated circuit device 104. The silicon shield 106 can be coupled to the integrated circuit device 104 on a side distal from the die attach 118 and the leadframe assembly 102. In implementations, the silicon shield 106 can include a layer of silicon or other durable and sacrificial material placed on the integrated circuit device 104, where the silicon shield 106 is configured to prevent stress to the sensitive integrated circuit device 104. The silicon shield 106 can include various sizes. For example, the silicon shield 106 can be just smaller in surface area on one side as the surface area on a corresponding side (e.g., side configured to be adjacent to the silicon shield 106) of the integrated circuit device 104. Further, the silicon shield can include various thicknesses. In a specific embodiment, the silicon shield 106 can be approximately 5 mm thick. It is contemplated that other silicon shield 106 sizes (e.g., dimensions of 0.5 mm×1.0 mm, 0.5 mm×0.5 mm, etc.) and thicknesses (e.g., 0.75 mm, 0.25 mm, 0.1 mm, etc.) can be utilized. As the surface mount semiconductor package 100 is fabricated, the surface mount semiconductor package 100 and integrated circuit device 104 undergoes stress. Adding the silicon shield 106 can protect the integrated circuit device 104 from the fabrication steps. In an embodiment, the silicon shield 106 can be placed on the integrated circuit device 104 with an adhesive layer 108 using die bonding techniques. Some examples of an adhesive layer 108 can include glues, thin films, epoxy, eutectic attach, or other adhesives suitable for adhering the silicon shield 106 to the integrated circuit device 104. For example, a silicon shield 106 can be coupled to the integrated circuit device 104 using an epoxy-based adhesive layer 108.

The surface mount semiconductor package 100 can include a molding layer 112 that encapsulates the integrated circuit device 104, the wirebond(s) 110, at least a portion of the leadframe assembly 102, and the silicon shield 106. As shown in FIGS. 1A and 1B, the molding layer 112 provides support and/or electrical insulation to the integrated circuit device 104, the leadframe assembly 102, the wirebond(s) 110, and the silicon shield 106. The molding layer 112 can be formed using a variety of processes, such as injection molding and/or transfer molding. The molding layer 112 can include a material configured to combine high physical strength with low stress and moisture absorption, such as silicone and/or epoxy. In one embodiment, the molding layer 112 includes a polymer material, such as epoxy, deposited over the surface mount semiconductor package 100. In other embodiments, the molding layer 112 can include other polymers and supporting materials.

FIG. 1A illustrates an exemplary surface mount semiconductor package 100 coupled with a printed circuit board 114. This view illustrates a diagrammatic cross-section view of the surface mount semiconductor package 100. In this view, the surface mount semiconductor package 100 can be coupled to the printed circuit board 114 to form a semiconductor device. FIG. 1B illustrates a plan view of a surface mount semiconductor package 100 showing the silicon shield 106 placed on a side of the integrated circuit device 104 distal from the lead frame assembly 102. In this embodiment, the integrated circuit device 104 is shown coupled to a lead frame assembly 102 using multiple wirebonds 110.

Example Processes

Figure 2:
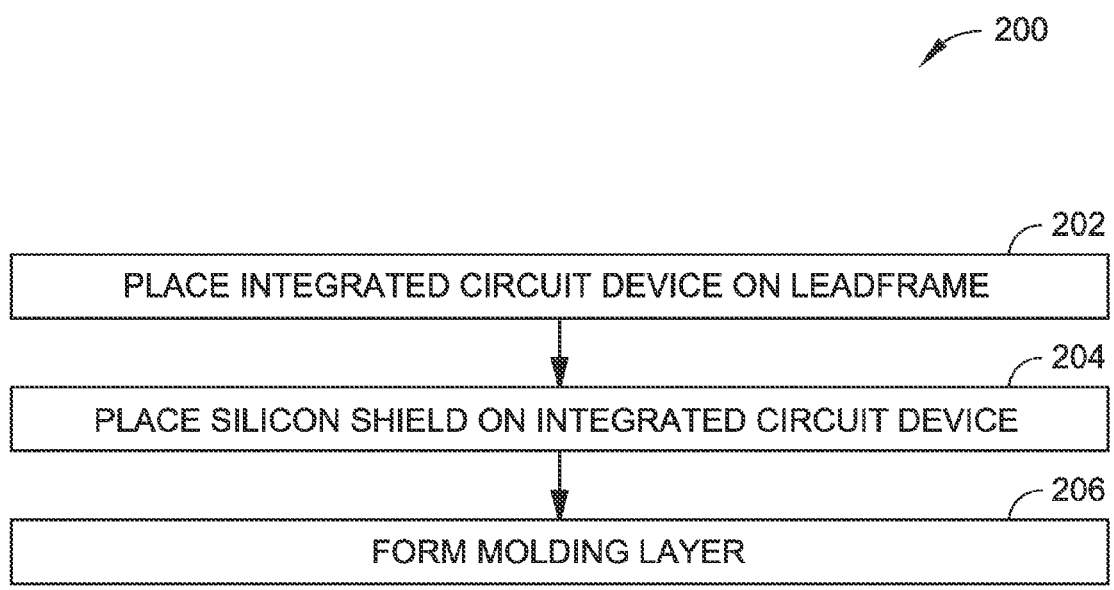
FIG. 2 is a flow diagram illustrating an example process for fabricating a surface mount semiconductor package that includes a silicon shield disposed on an integrated circuit die, such as the surface mount semiconductor package illustrated in FIGS. 1A and 1B.

FIG. 2 illustrates an example process 200 that employs techniques to fabricate semiconductor devices, such as the surface mount semiconductor package 100 and the semiconductor device shown in FIGS. 1A and 1B.

In the process 200 illustrated, an integrated circuit device is placed on the lead frame assembly (Block 202). In implementations, placing the integrated circuit device 104 on the lead frame assembly 102 can include using automated surface mount technology systems (e.g., pick-and-place technology) for the placing step. In some embodiments, placing the integrated circuit device 104 on the lead frame assembly 102 can include using a die attach 118 configured to adhere a polymer to a metal. In some implementations, placing the integrated circuit device 104 on the lead frame assembly 102 can further include die bonding techniques, such as epoxy bonding and/or eutectic die attach techniques. In a specific example, a suitable die attach 118 includes epoxy. In other embodiments, placing the integrated circuit device 104 on the leadframe assembly 102 can include placing a flip-chip type integrated circuit device 104 using solder connections. In implementations, placing the integrated circuit device 104 on the leadframe assembly 102 can include placing an integrated circuit device 104 on a central portion of the leadframe assembly 102. In other implementations, placing the integrated circuit device 104 can include placing the integrated circuit device 104 on non-central portions of the leadframe assembly 102.

Next, a silicon shield is placed on the integrated circuit device (Block 204). In some implementations, placing a silicon shield 106 includes placing a preformed silicon shield 106 configured for reducing fabrication stress on the integrated circuit device 104. In these implementations, the silicon shield can be formed by singulating a silicon wafer into suitable sizes to cover an integrated circuit device 104. Each silicon shield 106 can be placed on the integrated circuit device 104 using techniques, such as pick-and-place techniques and an adhesive layer 118. In embodiments, the silicon shield 106 can be the same or a different size than the surface of the integrated circuit device 104 and can be placed on the integrated circuit device 104 in different locations (e.g., centered, off-center, etc.). In a specific example, placing a silicon shield 108 includes placing a silicon shield 108 that has a smaller surface area than an integrated circuit device 104 on the center of the integrated circuit device 104 on a side distal from the die attach 118 and the leadframe assembly 102.

A molding layer is formed that encapsulates at least a portion of the surface mount semiconductor package (Block 206). In implementations, forming the molding layer 112 includes forming the molding layer 112 over the surface over the integrated circuit device 104, silicon shield 106, and leadframe assembly 102 subsequent to forming device interconnection(s) to provide support and insulation to the integrated circuit device 104 within the surface mount semiconductor package 100. For example, forming a molding layer 112 may include forming an epoxy encapsulation structure over and around an integrated circuit device 104 and at least part of a lead frame assembly 102, where a silicon shield has been coupled to the integrated circuit device 104. In some implementations, forming the molding layer 112 can include forming a polymer and/or an epoxy material using a molding process, such as injection molding, transfer molding, and/or compression molding. Injection molding can include injecting the molding material into a mold, which would include the surface mount semiconductor package 100. Transfer molding can include a process where the amount of molding material is measured and inserted into the mold cavity, which would include the surface mount semiconductor package 100. In some embodiments, multiple polymer layers (e.g., epoxy, etc.) may be deposited to form the molding layer 112. In a specific embodiment, forming the molding layer 112 includes using transfer molding to form an epoxy molding layer 112. In this specific embodiment, the leadframe assembly 102 and the integrated circuit device 104 are placed on a mold and the mold is closed. An epoxy (e.g., the molding layer 112) is transferred into the mold slowly so as to not bend the wirebond(s) 110, avoid voids, and to mitigate stress on the surface mount semiconductor package 100.

Subsequent to the molding process and forming the molding layer 112, the surface mount semiconductor package 100 can be further processed and/or coupled to other electronic devices, such as a printed circuit board 114, to form another electrical device.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A surface mount semiconductor package, comprising:
a leadframe assembly;
at least one integrated circuit device comprising a flip-chip die disposed on the leadframe assembly;
at least one silicon shield disposed on the at least one integrated circuit device, where the at least one silicon shield is configured to mitigate packaging stress to the at least one integrated circuit device; and
a molding layer that encapsulates the at least one integrated circuit device, the at least one silicon shield, and at least a portion of the leadframe assembly.
2. The surface mount semiconductor package of claim 1 where the leadframe assembly includes copper.
3. The surface mount semiconductor package of claim 1, where the at least one integrated circuit device includes a small-outline transistor.
4. The surface mount semiconductor package of claim 1, where the at least one integrated circuit device includes an active die.
5. The surface mount semiconductor package of claim 1, where the at least one integrated circuit device includes a passive device.
6. The surface mount semiconductor package of claim 1, where the at least one silicon shield includes a silicon shield with a thickness of approximately 5 mm.

7. The surface mount semiconductor package of claim 1, where the molding layer includes epoxy.

8. The surface mount semiconductor package of claim 1, further comprising:
   at least one wirebond that provides electrical communication between the leadframe assembly and the at least one integrated circuit device.

9. The surface mount semiconductor package of claim 8, where the at least one wirebond includes at least one of gold, aluminum, silver, or copper.

10. An electrical device, comprising:
    a printed circuit board; and
    a surface mount semiconductor package coupled to the printed circuit board, where the surface mount semiconductor package includes
    a leadframe assembly;
    at least one integrated circuit device comprising a flip-chip die disposed on the leadframe assembly;
    at least one silicon shield disposed on the at least one integrated circuit device, where the at least one silicon shield is configured to mitigate packaging stress to the at least one integrated circuit device; and
    a molding layer that encapsulates the at least one integrated circuit device, the at least one silicon shield, and at least a portion of the leadframe assembly.

11. The electrical device of claim 10, where the leadframe assembly includes copper.

12. The electrical device of claim 10, where the at least one integrated circuit device includes a small-outline transistor.

13. The electrical device of claim 10, where the at least one integrated circuit device includes an active die.

14. The electrical device of claim 10, where the at least one integrated circuit device includes a passive device.

15. The electrical device of claim 10, where the at least one silicon shield includes a silicon shield with a thickness of approximately 5 mm.

16. The electrical device of claim 10, where the molding layer includes epoxy.

17. The electrical device of claim 10, further comprising:
    at least one wirebond that provides electrical communication between the leadframe assembly and the at least one integrated circuit device.

* * * * *